(12) United States Patent
Hagio et al.

(10) Patent No.: US 6,188,283 B1
(45) Date of Patent: Feb. 13, 2001

(54) AMPLIFIER AND SEMICONDUCTOR DEVICE THEREFOR

(75) Inventors: Masahiro Hagio, Ohtsu; Kaname Motoyoshi, Nishinomiya; Masahiko Inamori, Takatsuki; Katsushi Tara, Kyoto, all of (JP)

(73) Assignee: Matsushita Electric Industrial Co., Ltd., Osaka (JP)

( * ) Notice: Under 35 U.S.C. 154(b), the term of this patent shall be extended for 0 days.

(21) Appl. No.: 09/272,326

(22) Filed: Mar. 19, 1999

(30) Foreign Application Priority Data

Apr. 16, 1998 (JP) .................................................. 10-106134

(51) Int. Cl.[7] .............................. H03G 3/10; H03F 3/14; H03F 3/04
(52) U.S. Cl. ......................... 330/285; 330/307; 330/310
(58) Field of Search .................................... 330/285, 307, 330/310

(56) References Cited

U.S. PATENT DOCUMENTS

| 4,646,028 | * | 2/1987 | Palmer ................................. 330/307 |
| 5,373,251 | * | 12/1994 | Kunitomo et al. .................... 330/285 |
| 5,455,968 | * | 10/1995 | Pham .................................... 330/285 |
| 5,574,402 | * | 11/1996 | Nakajima et al. .................... 330/307 |

FOREIGN PATENT DOCUMENTS

| 63-74816 | 5/1988 | (JP) . |
| 4277909 | 10/1992 | (JP) . |
| 5145349 | 6/1993 | (JP) . |
| 738352 | 2/1995 | (JP) . |

* cited by examiner

Primary Examiner—Robert Pascal
Assistant Examiner—Patricia T. Nguyen
(74) Attorney, Agent, or Firm—Stevens, Davis, Miller & Mosher, L.L.P.

(57) ABSTRACT

The present invention relates to an amplifier having high amplification efficiency. Amplification efficiency at low output is improved by reducing current at a latter stage depending on output power at the time when output power is reduced by gain control. In order to accomplish this improvement, gain control voltage applied to a gain control circuit for controlling the gain of a signal-amplifying field-effect transistor in a former stage is also applied simultaneously to a bias voltage control circuit for controlling the voltage between the gate and source of a signal-amplifying field-effect transistor in the latter stage, the voltage between the gate and source of the signal-amplifying field-effect transistor in the latter stage is controlled depending on the gain of the signal-amplifying field-effect transistor in the former stage to control the current between the drain and source of the signal-amplifying field-effect transistor in the latter stage. When the gain of the signal-amplifying field-effect transistor in the former stage is reduced, the current between the drain and source of the signal-amplifying field-effect transistor in the latter stage is reduced, whereby the efficiency of the amplifier is maintained high even when the output is low.

18 Claims, 5 Drawing Sheets

AMPLIFIER AND SEMICONDUCTOR DEVICE THEREFOR

BACKGROUND OF THE INVENTION

1. Field of the Invention

The present invention relates to an amplifier used for high-frequency circuits of television sets, communication apparatuses, etc. and capable of changing the gain thereof, and to a semiconductor device wherein the amplifier is integrated on a semiconductor substrate as a semiconductor integrated circuit and sealed in a package. More particularly, the present invention relates to improvement in the amplification efficiency of the amplifier at low gain.

2. Related Art

As amplifiers for high-frequency circuits of television sets, communication apparatuses, etc., semiconductor integrated circuits comprising field-effect transistors and each accommodated in a single package are commonly used. As one of these semiconductor integrated circuits, an amplifier having both gain and output power control functions is available.

FIG. 4 is a circuit diagram showing an amplifier comprising an amplifier having a gain control function (see Japanese Laid-open Patent Application NO. Hei 7-38352) combined with a field-effect transistor at the output stage thereof.

The circuit configuration of FIG. 4 will be described below in detail. The gate of a signal-amplifying field-effect transistor 1 in a first stage is connected to a amplification signal input terminal 4 via a coupling capacitor (coupling capacitance) 16. The control output end 19b of a gain control circuit 19 is connected to the gate (control portion) of the signal-amplifying field-effect transistor 1. The control input end 19a of the gain control circuit 19 is connected to a gain control terminal 3. The grounding end 19c of the gain control circuit 19 is grounded, i.e., connected to a ground GND used as a reference voltage line. Furthermore, the drain (main electrode; in some cases, the source may function as the main electrode) of the signal-amplifying field-effect transistor 1 is connected to a power voltage application terminal 5 via a drain bias choke coil 7. Moreover, the source of the signal-amplifying field-effect transistor 1 is grounded, i.e., connected to the ground GND used as the reference voltage line (common connection portion) via a parallel circuit comprising a source voltage self-bias resistor 12 and a capacitor 13. Additionally, the drain of the signal-amplifying field-effect transistor 1 is connected to the gate of a signal-amplifying field-effect transistor 2 in the next stage (the final stage in this example) via a coupling capacitor 17. The reference voltage line is not limited to the ground GND.

The gate of the signal-amplifying field-effect transistor 2 is connected to a gate bias voltage application terminal 9 via a gate bias setting resistor 10 and grounded, i.e., connected to the ground GND via a gate bias setting resistor 11. The drain of the signal-amplifying field-effect transistor 2 is connected to a power voltage application terminal 6 via a drain bias choke coil 8. In addition, the source of the signal-amplifying field-effect transistor 2 is grounded, i.e., connected to the ground GND via a parallel circuit comprising a source voltage self-bias resistor 14 and a capacitor 15. Furthermore, the drain of the signal-amplifying field-effect transistor 2 is connected to an amplification signal output terminal 18.

The signal input portion of the amplifier shown in FIG. 4, i.e., the gate of the signal-amplifying field-effect transistor 1 is provided with the attenuation-type gain control circuit 19 wherein part of an input signal is flown to the grounding terminal depending on gain control voltage applied to the gain control terminal 3. By the attenuation-type gain control circuit 19, input power to the signal-amplifying field-effect transistor 1 is reduced, whereby the output power of the amplifier can be reduced. When the input to the amplifier is assumed to be constant at this time, the output of the signal-amplifying field-effect transistor 1 changes depending on the gain control voltage (gain control signal) applied to the gain control terminal 3. As a result, the output of the signal-amplifying field-effect transistor 2 in the next stage, i.e., the output stage wherein the output of the signal-amplifying field-effect transistor 1 is received and amplified further also changes.

FIG. 5 shows the relationship between gain control voltage Vagc applied to the gain control terminal 3 and the output power Pout of the output terminal 18, and the relationship between the gain control voltage Vagc and the amplification efficiency η of the amplifier (output power Pout/power consumption P: the power efficiency of the amplifier required for input signal amplification). A solid line a represents the characteristic of the output power Pout at the output terminal 18 with respect to the gain control voltage Vagc. A broken line b represents the amplification efficiency η of the amplifier with respect to the gain control voltage Vagc. The output power changes depending on the gain control voltage Vagc as shown by the solid line a. This indicates that output voltage control is carried out.

In the above-mentioned conventional amplifier, the gate bias voltage of the signal-amplifying field-effect transistor 2 is set at a fixed value. Therefore, a relatively large drain current (main DC current) flows through the signal-amplifying field-effect transistor 2 even when the output power Pout is low. This causes a problem of lowering the amplification efficiency η to about 10% or less at low output as shown by the broken line b of FIG. 5.

For this reason, in portable terminals and apparatuses required to have reduced power consumption in particular, amplification efficiency related to power consumption efficiency is required to be improved. In digital communications in particular, transmission output is frequently required to be controlled depending on the distance from a base station. This case causes a serious problem of reducing amplification efficiency at low output. However, if an amplifier is designed to have high amplification efficiency at low output, a problem of deteriorating a distortion characteristic in signal amplification at high output, and the like are caused. Therefore, the amplifier is forced to be designed so that the characteristics of the amplifier become optimal at high output.

SUMMARY OF THE INVENTION

An object of the present invention is to provide an amplifier capable of raising amplification efficiency at low output while preventing the distortion characteristic thereof from deteriorating at high output.

Another object of the present invention is to provide an amplifier capable of reducing power consumption on the whole at the time when the amplifier is integrated.

The amplifier of the present invention is configured such that a signal-amplifying field-effect transistor having a gain control function in one stage, a signal-amplifying field-effect transistor in the next stage, and the like are connected via a coupling capacitor at least in two stages, wherein the bias voltage control circuit thereof is configured to reduce the drain current of the signal-amplifying field-effect transistor in the latter stage at the time when output power is lowered. With this configuration, amplification efficiency at low output is raised while preventing the distortion characteristic at high output from deteriorating, and a semiconductor device wherein the amplifier is integrated has low power consumption.

The present invention will be described below more specifically.

The amplifier of the present invention comprises signal-amplifying field-effect transistors at least in two stages, a gain control circuit and a bias voltage control circuit.

The above-mentioned signal-amplifying field-effect transistors at least in two stages are connected in cascade from the input side to the output side of an amplification signal so as to have a configuration wherein the main electrode of the signal-amplifying field-effect transistor in the former stage is connected to the control portion of the signal-amplifying field-effect transistor in the next stage at least via a coupling capacitor.

The control input end of the gain control circuit is connected to a gain control signal input portion for inputting a gain control signal. The control output end of the gain control circuit is connected to the control portion of a signal-amplifying field-effect transistor at least in one stage other than the final stage, among the signal-amplifying field-effect transistors at least in two stages. The gain control circuit having this configuration has a function to control the gain of the signal-amplifying field-effect transistor at least in one stage other than the final stage in accordance with the gain control signal.

The control output end of the bias voltage control circuit is connected to the control portion of a signal-amplifying field-effect transistor at least in one stage after a signal-amplifying field-effect transistor whose control portion is connected to the control output end of the gain control circuit. By this electric connection to the gain control circuit, the bias voltage control circuit has a function to reduce the main current of the signal-amplifying field-effect transistor at least in one stage after the signal-amplifying field-effect transistor whose control portion is connected to the control output end of the gain control circuit at the time when the gain of the signal-amplifying field-effect transistor at least in one stage other than the final stage is lowered.

With this configuration, when the gain of the signal-amplifying field-effect transistor at least in one stage other than the final stage is lowered, the main current of the signal-amplifying field-effect transistor at least in one stage after the signal-amplifying field-effect transistor whose control portion is connected to the control output end of the gain control circuit is lowered. As a result, power consumption at low output can be reduced, and the amplification efficiency of the amplifier at low output can be improved. In addition, the main current can be increased at high output, whereby the distortion characteristic at high output is not deteriorated.

The electrical connection from the bias voltage control circuit to the gain control circuit in the above-mentioned amplifier is accomplished by electrically connecting the control input end of the bias voltage control circuit to the gain control signal input portion. With this configuration, the bias voltage control circuit can also be controlled by the gain control signal.

With this configuration, bias voltage control can be carried out by using the same voltage as that of the gain control signal. Therefore, it is not necessary to separately generate a bias voltage control signal changing in response to the gain control signal, whereby the circuit configuration for bias voltage control can be simplified.

Furthermore, in the above-mentioned amplifier, the bias voltage control circuit is desired to be configured so as to control the voltage between the gate and source of the signal-amplifying field-effect transistor in the final stage, for example.

With this configuration, by controlling the voltage between the gate and source of the signal-amplifying field-effect transistor in the final stage, wherein the intensity of the signal generally becomes maximum and the current consumption thus becomes largest, the current consumption can be reduced, and amplification efficiency can be improved significantly. As a result, the current consumption of the amplifier can be improved significantly on the whole.

Moreover, in the above-mentioned amplifier, the control output end of the gain control circuit is desired to be connected to the control portion of the signal-amplifying field-effect transistor in the first stage.

With this configuration, the level of the input to the following signal-amplifying field-effect transistor can be lowered at the time of low gain, whereby the distortion characteristic of amplification characteristics can be improved. In addition, when the gain is reduced, the signal is sent to the grounding terminal while the intensity of the signal is lowest. Therefore, a loss in high-frequency power is low, and current consumption of the amplifier can be improved significantly on the whole.

Furthermore, in the above-mentioned amplifier, the bias voltage control circuit comprises a series connection circuit comprising a voltage-dividing resistor and a voltage-dividing field-effect transistor connected between a bias voltage application portion and a grounding point. The control portion of the voltage-dividing field-effect transistor is used as the control input end of the bias voltage control circuit, and the connection point of the voltage-dividing resistor and the voltage-dividing field-effect transistor is used as the control output end of the bias voltage control circuit.

With this configuration, the voltage-dividing field-effect transistor is used to control the bias voltage applied to the control portion of the signal-amplifying field-effect transistor at least in one stage after the signal-amplifying field-effect transistor whose control portion is connected to the control output end of the gain control circuit. As a result the bias voltage can be controlled by using very small current, and the increase in power consumption due to bias voltage control can be minimized.

Moreover, as a concrete configuration of the above-mentioned bias voltage connection circuit, the circuit is desired to be configured such that the control portion of the voltage-dividing field-effect transistor is electrically connected to the gain control signal input portion so as to control the signal-amplifying field-effect transistor by using the gain control signal.

With this configuration, bias voltage control can be carried out by using the same voltage as that of the gain control signal. Therefore, it is not necessary to separately generate a bias voltage control signal changing in response to the gain control signal, whereby the circuit configuration for bias voltage control can be simplified.

Furthermore, in the above-mentioned amplifier, the gain control circuit is desired to be an attenuation type for carrying out control to lower the gain of the signal-amplifying field-effect transistor at least in one stage other than the final stage, and connected to the reference voltage line.

With this configuration, since the gain control circuit is an attenuation type, in addition to the gate bias at the signal-amplifying field-effect transistor at least in one stage other than the final stage, the effect of relieving an input amplification signal to the reference voltage side by the gain control circuit to reduce the level of the signal is also applied. Consequently, gain control at the time when the level of the input signal (input amplification signal) is high can be accomplished without increasing the gate bias higher than a conventional value, whereby high-frequency distortion due to gain control can be reduced.

Furthermore, in the above-mentioned amplifier, the gain control circuit is desired to be configured such that at least a gain control field-effect transistor is connected between the gain control signal input portion and the control portion of the signal-amplifying field-effect transistor at least in one stage other than the final stage.

With this configuration, the gain control field-effect transistor is used between the gain control signal input portion and the control portion of the signal-amplifying field-effect transistor at least in one stage other than the final stage. Therefore, the gain control circuit and the signal-amplifying field-effect transistor at least in one stage other than the final stage are formed of the same type of field-effect transistor, whereby gain control can be carried out smoothly (without distortion, discontinuity, etc.). In particular, in the case when the gain control circuit is an attenuation type for carrying out control to lower the gain of the signal-amplifying field-effect transistor at least in one stage other than the final stage, gain control can be carried out when the level of the input signal is high. With this additional effect, gain control can be carried out more smoothly.

In the above-mentioned amplifier, in the case when at least the gain control field-effect transistor is connected between the gain control signal input portion and the control portion of the signal-amplifying field-effect transistor at least in one stage other than the final stage, it is desired that at least the threshold voltage of the gain control field-effect transistor and the threshold voltage of the voltage-dividing field-effect transistor are set so as to be nearly equal to each other.

With this configuration, the threshold voltage of the gain control field-effect transistor and the threshold voltage of the voltage-dividing field-effect transistor are nearly equal to each other, whereby the interlocked operations of the gain control circuit and the bias voltage control circuit can be accomplished by using a simple circuit.

Additionally, in the above-mentioned amplifier, at least the threshold voltage of the signal-amplifying field-effect transistor at least in one stage other than the final stage and the threshold voltage of the gain control field-effect transistor can also be set so as to be nearly equal to each other.

With this configuration, the gain control field-effect transistor is used between the gain control signal input portion and the control portion of the signal-amplifying field-effect transistor at least in one stage other than the final stage. Therefore, the gain control circuit and the signal-amplifying field-effect transistor at least in one stage other than the final stage are formed of the same type of field-effect transistor, and their threshold voltage values are nearly equal to each other, whereby gain control can be carried out more smoothly.

The semiconductor device of the present invention is obtained by carrying out processing wherein the amplifier comprising the signal-amplifying field-effect transistors at least in two stages, the gain control circuit and the bias voltage control circuit is integrated on a semiconductor substrate, sealed in a package, and provided with external terminals on the package. These external terminals are a signal input terminal for inputting an amplification signal to the control portion of the signal-amplifying field-effect transistor at least in the first stage, a signal output terminal for outputting the amplification signal from the main electrode of the signal-amplifying field-effect transistor in the final stage and a gain control terminal for inputting the gain control signal to the gain control signal input portion.

The above-mentioned signal-amplifying field-effect transistors at least in two stages are connected in cascade from the input side to the output side of the amplification signal so as to have a configuration wherein the main electrode of the signal-amplifying field-effect transistor in the former stage is connected to the signal-amplifying field-effect transistor in the next stage at least via a coupling capacitor.

The control input end of the gain control circuit is connected to the gain control signal input portion for inputting a gain control signal. The control output end of the gain control circuit is connected to the control portion of the signal-amplifying field-effect transistor at least in one stage other than the final stage, among the signal-amplifying field-effect transistors at least in two stages. The gain control circuit having this configuration has a function to control the gain of the signal-amplifying field-effect transistor at least in one stage other than the final stage in accordance with the gain control signal.

The control output end of the bias voltage control circuit is connected to the control portion of the signal-amplifying field-effect transistor at least in one stage after the signal-amplifying field-effect transistor whose control portion is connected to the control output end of the gain control circuit. By this electric connection to the gain control circuit, the bias voltage control circuit has a function to reduce the main current of the signal-amplifying field-effect transistor at least in one stage after the signal-amplifying field-effect transistor whose control portion is connected to the control output end of the gain control circuit at the time when the gain of the signal-amplifying field-effect transistor at least in one stage other than the final stage is lowered.

With this configuration, when the gain of the signal-amplifying field-effect transistor at least in one stage other than the final stage is lowered, the main current of the signal-amplifying field-effect transistor at least in one stage after the signal-amplifying field-effect transistor whose control portion is connected to the control output end of the gain control circuit is lowered. As a result, power consumption at low output can be reduced, and the amplification efficiency of the amplifier at low output can be improved. In addition, the main current can be increased at high output, whereby the distortion characteristic at high output is not deteriorated. Furthermore, the amplification efficiency of the amplifier at low output can be improved. As a result, the power consumption of the amplifier can be reduced on the whole.

In the above-mentioned semiconductor device, the power voltage application terminal for applying power voltage to the signal-amplifying field-effect transistor at least in one stage other than the final stage and the bias voltage application terminal for supplying bias voltage to the bias voltage control circuit are combined so as to be used as a single common terminal.

With this configuration, the number of terminals provided on the package can be reduced.

DETAILED DESCRIPTION OF THE INVENTION

First Embodiment

Figure 1:
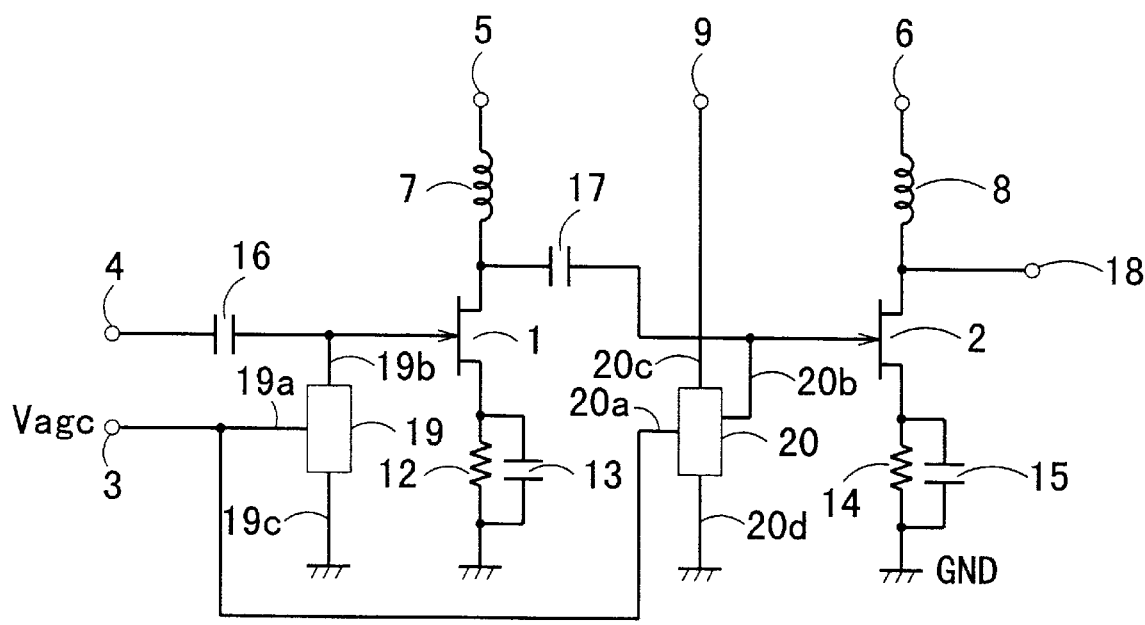
FIG. 1 is a circuit diagram showing the configuration of an amplifier in accordance with a first embodiment of the present invention.
Figure 4:
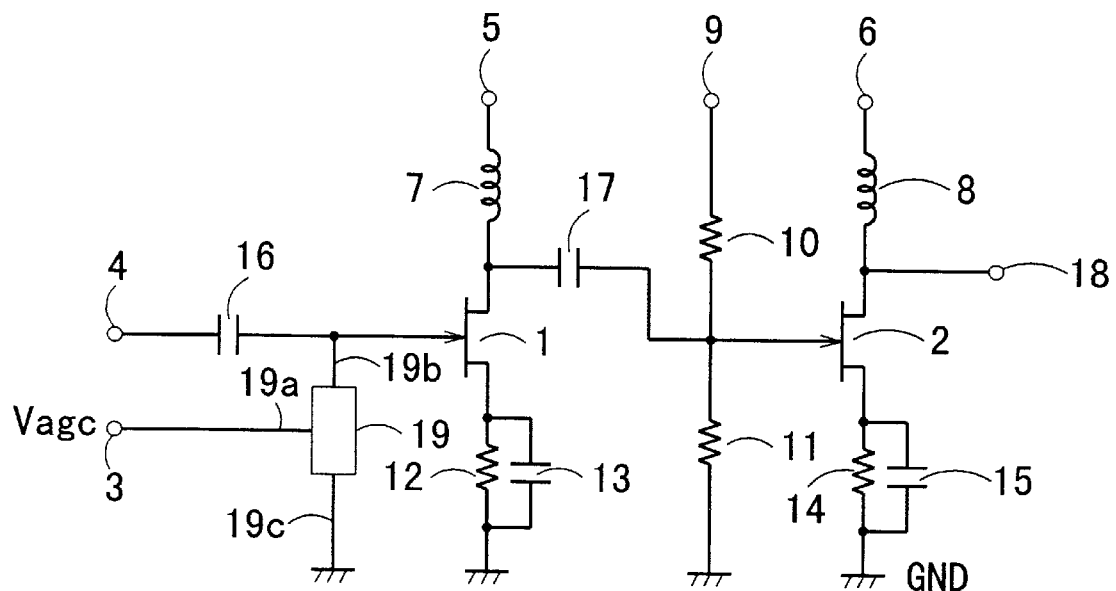
FIG. 4 is a circuit diagram showing the configuration of a conventional amplifier having a gain control function.
Figure 5:
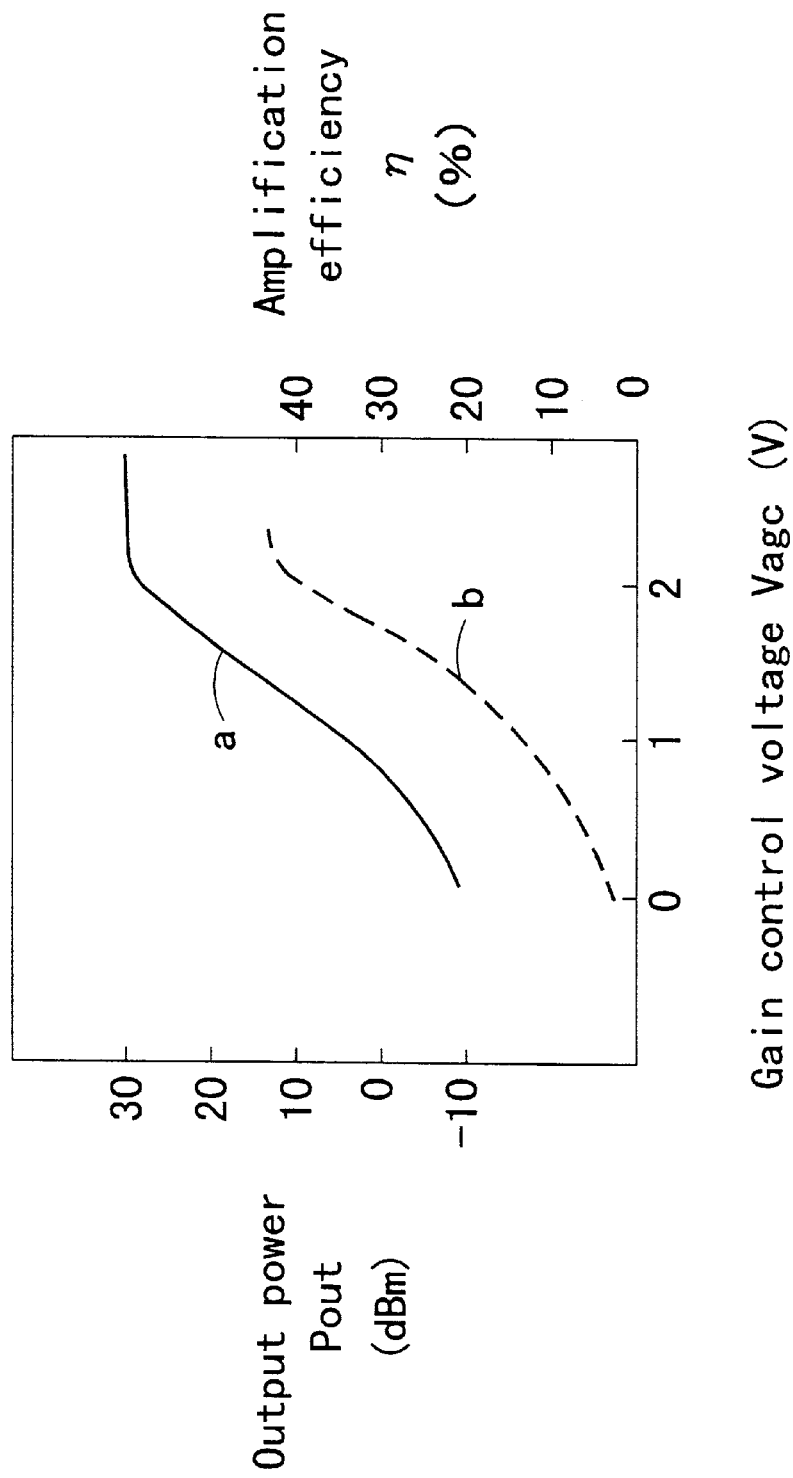
FIG. 5 is a characteristic graph showing examples of output power control characteristics of the conventional amplifier having a gain control function.

FIG. 1 is a circuit diagram showing the circuit configuration of an amplifier in accordance with a first embodiment of the present invention. This amplifier differs from the conventional example shown in FIG. 4 in that a bias voltage control circuit 20 is provided instead of the gate bias setting resistors 10, 11 shown in FIG. 4, and that the control input end 20a of the bias voltage control circuit 20 is electrically connected to a gain control terminal 3 just as the control input end 19a of a gain control circuit 19 is connected thereto. In other respects, the configuration of this embodiment is the same as that of the amplifier shown in FIG. 4.

In other words, in the amplifier in accordance with this embodiment, signal-amplifying field-effect transistors 1, 2 in two stages are connected in cascade from the input side to the output side for an amplification signal so that the drain of the signal-amplifying field-effect transistor 1 in a former stage is connected to the gate of the signal-amplifying field-effect transistor 2 in the next stage via a coupling capacitor (coupling capacitance) 17. Furthermore, the gain control circuit 19 and the bias voltage control circuit 20 are added to the signal-amplifying field-effect transistors 1, 2, respectively.

The gain control circuit 19 controls the gain of the signal-amplifying field-effect transistor 1 in the former stage depending on a gain control signal Vagc. The control input end 19a is connected to the gain control terminal 3 for inputting the gain control signal Vagc. The control output end 19b of the gain control circuit 19 is connected to the gate (control portion) of the signal-amplifying field-effect transistor 1. With this configuration, the gain of the signal-amplifying field-effect transistor 1 is controlled depending on the gain control signal Vagc.

Furthermore, the bias voltage control circuit 20 controls the gate bias voltage of the signal-amplifying field-effect transistor 2 in the second stage depending on the above-mentioned gain control signal Vagc interlocked with the gain control by the gain control circuit 19. The control output end 20b of the bias voltage control circuit 20 is connected to the gate (control portion) of the signal-amplifying field-effect transistor 2, and the control input end 19a of the gain control circuit 19 is electrically connected to the control input end 20a of the gain control circuit 20. With this configuration, when the gain of the signal-amplifying field-effect transistor 1 in the former stage is reduced, the voltage between the gate and the source of the signal-amplifying field-effect transistor 2 is controlled interlocked with the reduction, whereby the drain current (main current) of the signal-amplifying field-effect transistor 2 is reduced. The bias voltage input end 20c of the bias voltage control circuit 20 is connected to a bias voltage application terminal 9, and the grounding end 20d thereof is grounded, i.e., connected to the ground GND used as a reference voltage line.

In the first embodiment, the amplifier shown in FIG. 1 is produced as a semiconductor integrated circuit wherein MES-type field-effect transistors, capacitors, etc. are integrated on a single substrate formed of a semiconductor compound. This semiconductor integrated circuit is accommodated in a single package sealed with resin to form a semiconductor device. In other words, this semiconductor device is obtained by carrying out processing wherein the amplifier is integrated on a semiconductor substrate, sealed in a package, and provided with external terminals on the package.

The field-effect transistor has a gate used as a control portion, a drain used as a main electrode and a source (the main current flows). In addition, the semiconductor device with the amplifier has external terminals on the package thereof: a signal input terminal 4 for inputting an amplification signal to the control portion of the signal-amplifying field-effect transistor 1 at least in the first stage, the gain control terminal 3 for inputting the gain control signal Vagc to the gain control circuit 19, and a signal output terminal 18 for outputting the amplification signal from the main electrode of the signal-amplifying field-effect transistor 2 in the final stage.

This embodiment has power voltage application terminals 5, 6 and the bias voltage application terminal 9. The bias voltage application terminal 9 can be connected to one of the power voltage application terminals 5, 6 so as to be connected in common to each other. With this configuration, the special-purpose bias voltage application terminal 9 can be omitted, and the number of terminals can be reduced.

The amplifier of the present invention is characterized in that the gain control circuit 19 connected to the gain control terminal 3 is connected to the bias voltage control circuit 20 for controlling the gate bias voltage of the signal-amplifying field-effect transistor 2. In this embodiment in particular, the control input end 19a of the gain control circuit 19 is electrically connected to the control input end 20a of the bias voltage control circuit 20.

By using the voltage at the gate bias voltage application terminal 9 and the voltage applied from the gain control terminal 3 via the gain control circuit 19, the bias voltage control circuit 20 controls the gate bias voltage of the signal-amplifying field-effect transistor 2 used as an output stage. In other words, the drain current (the main DC current) of the signal-amplifying field-effect transistor 2 becomes large when the output of the amplifier is high, and becomes small when the output is low, whereby relatively high amplification efficiency can be maintained even when the output power level at the signal output terminal 18 becomes low because of the gain control voltage from the gain control terminal 3.

In the case when the signal-amplifying field-effect transistor 2 is an MES-type field-effect transistor (Schottky-gate-type field-effect transistor) having a threshold voltage Vp (Vp<0V), for example, the gate voltage of the signal-amplifying field-effect transistor 2 is set at 0V at high output, set at a voltage near the threshold voltage Vp at low output, and set at a value between the threshold voltage Vp and 0V at middle output, interlocked with the gain control of the signal-amplifying field-effect transistor 1, in the relationship from the gain control circuit 19 to the bias voltage control circuit 20. As a result, high amplification efficiency can be maintained even if the output level is changed by the gain control circuit 19. Therefore, amplification efficiency at low output can be raised while preventing the distortion characteristic at high output from deteriorating. Furthermore, the semiconductor device wherein the amplifier is integrated can have high amplification efficiency when the output of the amplifier is low. As a result, the power consumption of the device can be reduced on the whole.

The gain control input portion corresponds to the range from the gain control terminal 3 to the gain control circuit 19 (internal electrodes may sometimes be included as equivalent circuit components).

In this embodiment, the bias voltage control circuit 20 is electrically connected to the gain control circuit 19 as described above. When the gain of the signal-amplifying field-effect transistor 1 at least in one stage other than the final stage is lowered, the main current of the signal-amplifying field-effect transistor 2 at least in one stage after the signal-amplifying field-effect transistor 1 whose control portion (gate) is connected to the control output end 19b of the gain control circuit 19 is lowered. As a result, power consumption at low output can be reduced, and the amplification efficiency of the amplifier at low output can be improved. In addition, the main current can be increased at high output, whereby the distortion characteristic at high output is not deteriorated.

Furthermore, since the control input end 20a of the bias voltage control circuit 20 is electrically connected to the gain control terminal 3, and bias voltage control is carried out depending on the gain control signal Vagc, it is not necessary to separately generate a bias voltage control signal changing in response to the gain control signal Vagc, whereby the circuit configuration for bias voltage control can be simplified.

Moreover, the bias voltage control circuit 20 controls the voltage between the gate and source of the signal-amplifying field-effect transistor 2 in the final stage, wherein the intensity of the signal generally becomes maximum and the current consumption thus becomes largest, in order to reduce the current consumption, whereby the efficiency of the amplifier can be improved significantly.

Additionally, since the gain control circuit 19 is provided at the control portion (gate) of the signal-amplifying field-effect transistor 1 in the first stage, the level of the input to the following signal-amplifying field-effect transistor 2 can be lowered at the time of low gain, whereby the distortion characteristic of amplification characteristics can be improved.

Furthermore, the gain control circuit 20 is an attenuation type for carrying out control to lower the gain of the signal-amplifying field-effect transistor 1 at least in one stage other than the final stage, and is connected to the reference voltage line. Therefore, in addition to the gate bias at the signal-amplifying field-effect transistor 1 at least in one stage other than the final stage, the effect of relieving an input amplification signal to the reference voltage side by the gain control circuit 19 to reduce the level of the signal is also applied. Consequently, gain control at the time when the level of the input signal (input amplification signal) is high can be accomplished without increasing the gate bias higher than a conventional value, whereby high-frequency distortion due to gain control can be reduced.

Second embodiment

Figure 2:
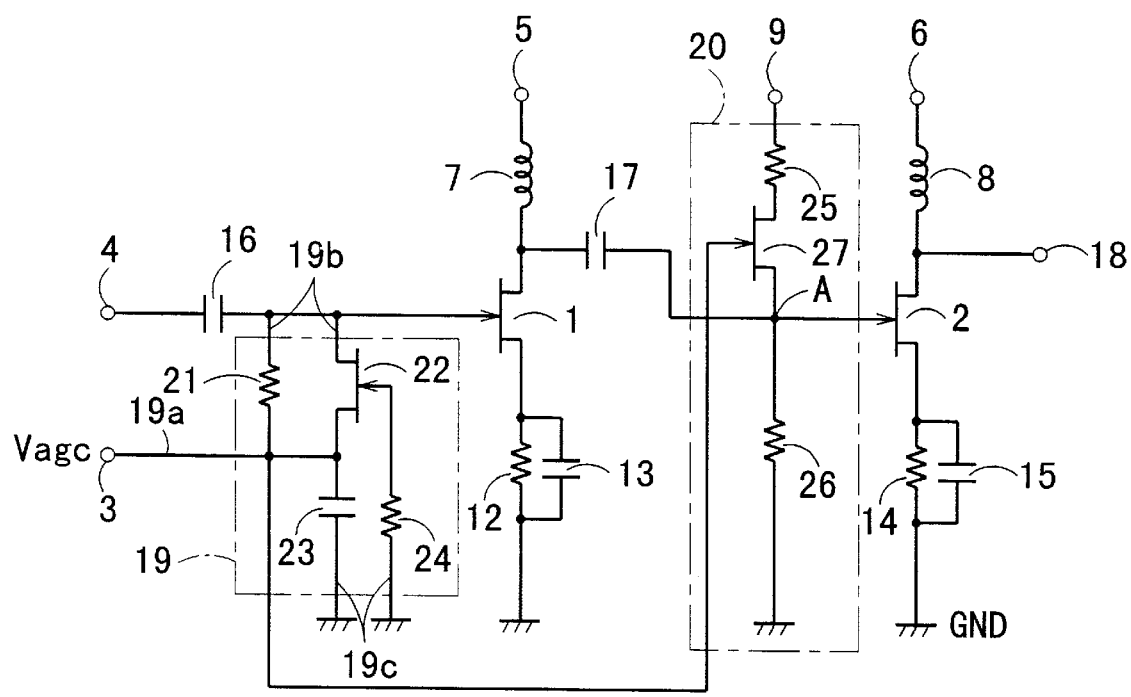
FIG. 2 is a circuit diagram showing the configuration of an amplifier in accordance with a second embodiment of the present invention.

Next, a second embodiment in accordance with the present invention will be described referring to FIG. 2. This embodiment discloses the concrete configurations of the gain control circuit 19 and the bias voltage control circuit 20 of the amplifier shown in FIG. 1. In other respects, the configuration shown in FIG. 2 is the same as that shown in FIG. 1.

In the gain control circuit 19, a resistor 21 and a gain control field-effect transistor 22 are connected in parallel, and this parallel circuit is connected to a capacitor 23 in series. The parallel circuit side of this series connection circuit is connected to the gate of the signal-amplifying field-effect transistor 1, and the side of the capacitor 23 is grounded. Furthermore, one end of a resistor 24 is connected to the gate of the gain control field-effect transistor 22, and the other end of the resistor 24 is grounded.

In the bias voltage control circuit 20, a series connection circuit comprising a voltage-dividing resistor 25 and a voltage-dividing field-effect transistor 27 is connected between the gate bias voltage application terminal 9 and the gate of the signal-amplifying field-effect transistor 2. One end of the voltage-dividing resistor 26 is connected to the gain of the signal-amplifying field-effect transistor 2, and the other end of the voltage-dividing resistor 26 is grounded. By controlling a voltage applied to the gate of the voltage-dividing field-effect transistor 27, the voltage-dividing ratio between the series connection circuit comprising the voltage-dividing resistor 25 and the voltage-dividing field-effect transistor 27 and the voltage-dividing resistor 26 is changed to carry out bias voltage control. In this case, the gain control signal Vagc applied to the gain control terminal 3 is also applied simultaneously and directly to the gate of the voltage-dividing field-effect transistor 27.

When it is assumed that the signal-amplifying field-effect transistor 1, the signal-amplifying field-effect transistor 2, the voltage-dividing field-effect transistor 27 and the gain control field-effect transistor 22 constituting the gain control circuit 19 have a threshold voltage of Vp (Vp<0), the following setting is carried out to obtain high output, for example.

$$\text{Vagc} > -\text{Vp} \tag{1}$$

At this time, the gain control field-effect transistor 22 is in the off condition, and an amplification signal having been input from the input terminal 4 is not sent to the grounding terminal by the gain control circuit 19, but is input to the signal-amplifying field-effect transistor 1 and amplified. Furthermore, the following setting is carried out to obtain low output.

$$\text{Vagc} < -\text{Vp} \tag{2}$$

At this time, the gain control field-effect transistor 22 is in the on condition, part of the signal having been input from the input terminal 4 is sent to the grounding terminal by the gain control circuit 19, and the intensity of the signal to be input to the signal-amplifying field-effect transistor 1 becomes weaker.

In the above-mentioned conditions (1) and (2), the gain control signal Vagc has also been applied to the gate of the voltage-dividing field-effect transistor 27. The resistance of the voltage-dividing field-effect transistor 27 at the time when the field-effect transistor 27 is on in the condition (2) is higher than that in the condition (1). As a result, the voltage at point A from which the gate bias voltage for the field-effect transistor 2 is applied becomes lower in the condition (2) than that in the condition (1). Consequently, the gate bias for the signal-amplifying field-effect transistor 2 becomes larger in the condition (2) than that in the condition (1), and the current is reduced. In other words, power consumption is reduced when output power is reduced, whereby efficiency drop at low output can be prevented. Distortion at high output is low as describe above.

Figure 3:
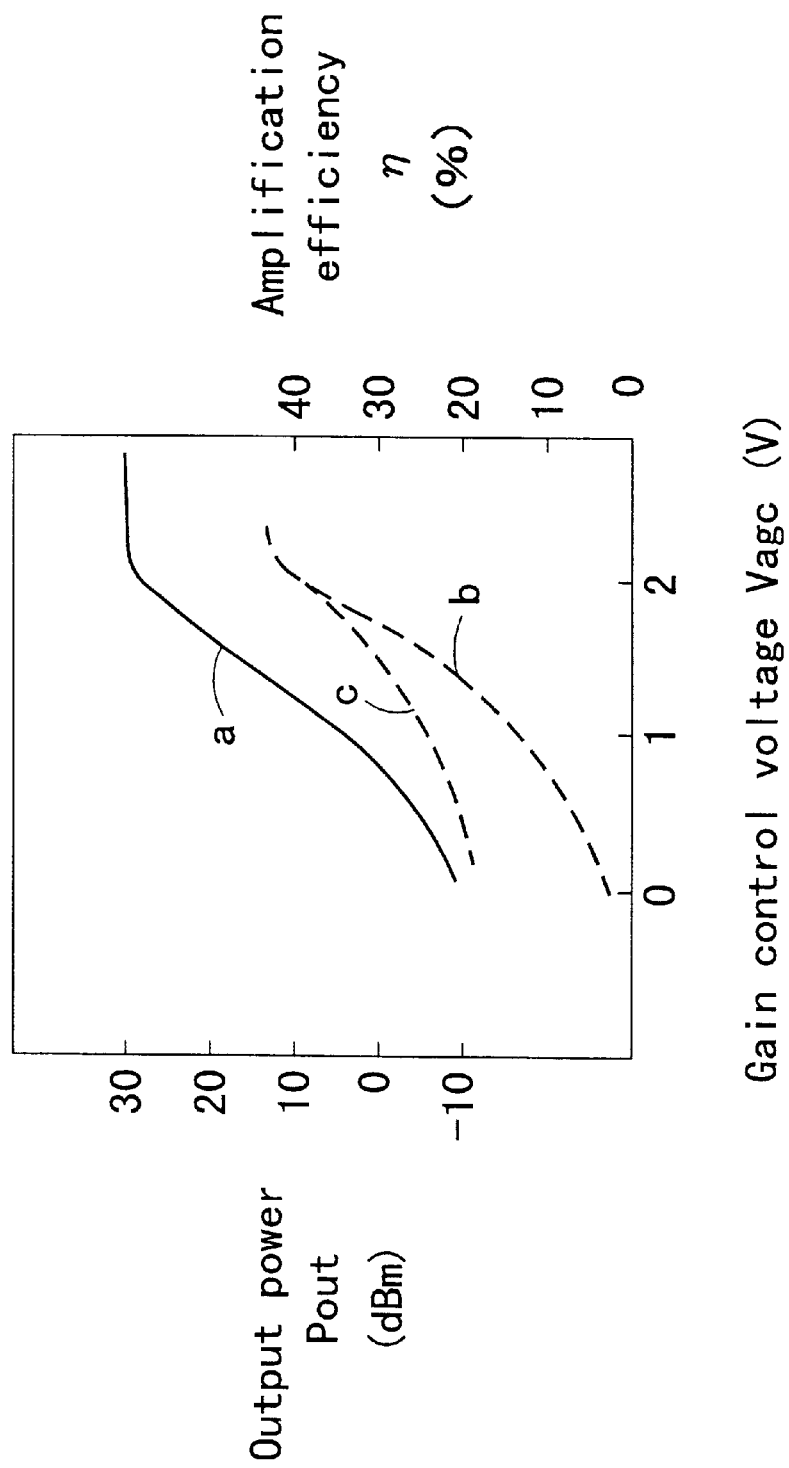
FIG. 3 is a characteristic graph showing examples of output power control characteristics of the amplifier in accordance with the second embodiment of the present invention.

FIG. 3 is a graph showing improvement in the amplification efficiency of the amplifier in accordance with the second embodiment of the present invention. FIG. 3 also shows the relationship between the gain control voltage Vagc applied to the gain control terminal 3, and the relationship between the gain control voltage Vagc and the amplification efficiency η of the amplifier in comparison with the amplification efficiency of the amplifier having the conventional circuitry. In FIG. 3, a solid line a represents the characteristic of output power Pout with respect to the gain control voltage Vagc. A broken line b represents the characteristic of the amplification efficiency η of the amplifier having the conventional circuitry with respect to the gain control voltage Vagc. A broken line c represents the characteristic of the amplification efficiency η of the amplifier having the circuitry of the present invention with respect to the gain control voltage Vagc. It is understood that the amplification efficiency of the amplifier at low output has been improved significantly by using the circuitry of the present invention As described above, in accordance with this embodiment, the voltage-dividing field-effect transistor 27 is used to control the bias voltage applied to the control portion (gate) of the signal-amplifying field-effect transistor 2 at least in one stage after the signal-amplifying field-effect transistor 1, whose control portion (gate) is connected to the control output end 19b of the gain control circuit 19. As a result the bias voltage can be controlled by using very small current, and the increase in power consumption due to bias voltage control can be minimized.

In addition, since the control portion (gate) of the voltage-dividing field-effect transistor 27 is electrically connected to the gain control terminal 3, and bias voltage control is carried out depending on the gain control signal Vagc, it is not necessary to separately generate a bias voltage control signal changing in response to the gain control signal Vagc, whereby the circuit configuration for bias voltage control can be simplified.

Furthermore, the gain control field-effect transistor 22 is used between the gain control terminal 3 and the control portion of the signal-amplifying field-effect transistor 1 at least in one stage other than the final stage. Therefore, the gain control circuit 19 and the signal-amplifying field-effect transistor 1 at least in one stage other than the final stage are formed of the same type of field-effect transistor, whereby gain control can be carried out smoothly (without distortion, discontinuity, etc.). In particular, the gain control circuit 19 is an attenuation type and connected to the reference voltage line, and the effect by this configuration is added, whereby gain control can be carried out more smoothly.

Moreover, since the threshold voltage of the gain control field-effect transistor 22 and the threshold voltage of the voltage-dividing field-effect transistor 27 are set so as to be nearly equal to each other, the interlocked operations of the gain control circuit 19 and the bias voltage control circuit 20 can be accomplished by using a simple circuit.

Additionally, the gain control field-effect transistor 22 is used between the gain control terminal 3 and the control portion of the signal-amplifying field-effect transistor 1 at least in one stage other than the final stage. Therefore, the gain control circuit 19 and the signal-amplifying field-effect transistor 1 at least in one stage other than the final stage are formed of the same type of field-effect transistor, and their threshold voltage values are nearly equal to each other, whereby gain control can be carried out more smoothly.

Although the signal-amplifying field-effect transistors 1, 2 are connected in only two stages in the above-mentioned embodiments, signal-amplifying field-effect transistors connected in three or more stages can be used as a matter of course. In this case, the bias voltage control circuit is provided for a signal-amplifying field-effect transistor in one stage after a signal-amplifying field-effect transistor provided with the gain control circuit, and is also provided for the signal-amplifying field-effect transistor in the final stage so as to be most effective in improving amplification efficiency.

What is claimed is:

1. An amplifier comprising:
   signal-amplifying field-effect transistors at least in two stages connected in cascade from the input side to the output side of an amplification signal so as to have a configuration wherein a signal from the main electrode of said signal-amplifying field-effect transistor in a former stage is received by a control portion of said signal-amplifying field-effect transistor in a latter stage;
   a gain control circuit which has a first control input end connected to a gain control signal input portion for inputting a gain control signal and a first control output end connected to the control portion of a signal-amplifying field-effect transistor at least in said former stage, and which is capable of controlling the gain of said signal-amplifying field-effect transistor in said former stage in accordance with said gain control signal; and
   a bias voltage control circuit which has a second control input end connected to said gain control signal input portion and a second control output end connected to the control portion of said signal-amplifying field-effect transistor in said latter stage and which is capable of controlling a main current of said signal-amplifying field-effect transistor in said latter stage according to said rain control signal, wherein the main current of said signal amplifying field-effect transistor in said latter stage is reduced when the gain of said signal-amplifying field-effect transistor in said former stage is lowered.

2. An amplifier in accordance with claim 1, wherein said bias voltage control circuit controls the voltage between the gate and source of said signal-amplifying field-effect transistor in said latter stage.

3. An amplifier in accordance with claim 1, wherein said first control output end of said gain control circuit is connected to said control portion of said signal-amplifying field-effect transistor in said former stage.

4. An amplifier in accordance with claim 1, wherein said bias voltage control circuit comprises a series connection circuit comprising a voltage-dividing resistor and a voltage-dividing field-effect transistor connected between a bias voltage application portion and a grounding point, said control portion of said voltage-dividing field-effect transistor is used as said control input end of said bias voltage control circuit, and the connection point of said voltage-dividing resistor and said voltage-dividing field-effect transistor is used as said second control output end of said bias voltage control circuit.

5. An amplifier in accordance with claim 4, wherein said control portion of said voltage-dividing field-effect transistor is connected to said gain control signal input portion in order to control said voltage-dividing field-effect transistor by using said gain control signal.

6. An amplifier in accordance with claim 1, wherein said gain control circuit is an attenuation type for carrying out control to lower the gain of said signal-amplifying field-effect transistor in said former stage, and is connected to a reference voltage line.

7. An amplifier in accordance with claim 1, wherein said gain control circuit is configured such that at least a gain control field-effect transistor is connected between said gain control signal input portion and said control portion of said signal-amplifying field-effect transistor in said former stage.

8. An amplifier in accordance with claim 7, wherein at least the threshold voltage of said gain control field-effect transistor and the threshold voltage of said voltage-dividing field-effect transistor are nearly equal to each other.

9. An amplifier in accordance with claim 7, wherein at least the threshold voltage of said signal-amplifying field-effect transistor in said former stage and the threshold voltage of said gain control field-effect transistor are nearly equal to each other.

10. A semiconductor device for an amplifier, said amplifier comprising:

signal-amplifying field-effect transistors at least in two stages connected in cascade from the input side to the output side of an amplification signal so as to have a configuration wherein the main electrode of said signal-amplifying field-effect transistor in a former stage is connected to the control portion of said signal-amplifying field-effect transistor in the next stage at least via a coupling capacitor;

a gain control circuit, the control input end of which is connected to a gain control signal input portion for inputting a gain control signal, and the control output end of which is connected to the control portion of a signal-amplifying field-effect transistor at least in one stage other than the final stage, among said signal-amplifying field-effect transistors at least in two stages, being capable of controlling the gain of said signal-amplifying field-effect transistor at least in one stage other than the final stage in accordance with said gain control signal; and a bias voltage control circuit, the control output end of which is connected to the control portion of a signal-amplifying field-effect transistor at least in one stage after a signal-amplifying field-effect transistor whose control portion is connected to said control output end of said gain control circuit, by the electrical connection to said gain control circuit, being capable of reducing the main current of said signal-amplifying field-effect transistor at least in one stage after said signal-amplifying field-effect transistor whose control portion is connected to said control output end of said gain control circuit at the time when the gain of said signal-amplifying field-effect transistor at least in one stage other than the final stage is lowered, wherein said amplifier is integrated on a semiconductor substrate, sealed in a package, and provided on said package with external terminals: a signal input terminal for inputting an amplification signal to said control portion of said signal-amplifying field-effect transistor at least in the first stage, a signal output terminal for outputting said amplification signal from the main electrode of said signal-amplifying field-effect transistor in the final stage and a gain control terminal for inputting said gain control signal to said gain control signal input portion.

11. A semiconductor device in accordance with claim 10, wherein a power voltage application terminal for applying power voltage to said signal-amplifying field-effect transistor at least in one stage other than the final stage and a bias voltage application terminal for supplying bias voltage to said bias voltage control circuit are combined so as to be used as a single common terminal.

12. An amplifier in accordance with claim 2, wherein said first control output end of said gain control circuit is connected to said control portion of said signal-amplifying field-effect transistor in said former stage.

13. An amplifier in accordance with claim 6, wherein said gain control circuit is configured such that at least a gain control field-effect transistor is connected between said gain control signal input portion and said control portion of said signal-amplifying field-effect transistor in said former stage.

14. An amplifier in accordance with claim 13, wherein at least the threshold voltage of said gain control field-effect transistor and the threshold voltage of said voltage-dividing field-effect transistor are nearly equal to each other.

15. An amplifier in accordance with claim 13, wherein at least the threshold voltage of said signal-amplifying field-effect transistor in said former stage and the threshold voltage of said gain control field-effect transistor are early equal to each other.

16. A semiconductor device including an amplifier, said amplifier comprising:

signal-amplifying field-effect transistors at least in two stages connected in cascade from the input side to the output side of an amplification signal so as to have a configuration wherein a signal from the main electrode of said signal-amplifying field-effect transistor in a former stage is received by a control portion of said signal-amplifying field-effect transistor in a latter stage, a gain control circuit which has a first control input end connected to a gain control signal input portion for inputting a gain control signal and a first control output end connected to the control portion of a signal-amplifying field-effect transistor at least in said former stage and which is capable of controlling the gain of said signal-amplifying field-effect transistor in said former stage in accordance with said gain control signal; and a bias voltage control circuit which has a second control input end connected to said gain control signal input portion and a second control output end connected to said control portion of said signal-amplifying field-effect transistor in said latter stage and which is capable of controlling a main current of said signal-amplifying field-effect transistor in said latter stage according to said gain control signal, wherein the main current of said signal amplifying field-effect transistor in said latter stage is reduced when the gain of said signal-amplifying field-effect transistor in said former stage is lowered;

a semiconductor substrate having said amplifier integrated thereon so as to be scaled in a package having, as external terminals, a signal input terminal for inputting an amplification signal to said control portion of said signal-amplifying field-effect transistor at least in said first stages a signal output terminal for outputting said amplification signal from the main electrode of said signal-amplifying field-effect transistor in said final stage, and a gain control terminal for inputting said gain control signal to said gain control signal input portion.

17. An amplifier comprising:

signal-amplifying field-effect transistors at least in two stages connected in cascade from the input side to the output side of an amplification signal so as to have a configuration wherein a signal from the main electrode of said signal-amplifying field-effect transistor in a former stage is received by a control portion of said signal-amplifying field-effect transistor in a latter stage;

a gain control circuit which has a first control input end connected to a gain control signal input portion for inputting a gain control signal and a first control output end connected to the control portion of a signal-amplifying field-effect transistor at least in said former stage and which is capable of controlling the gain of said signal-amplifying field-effect transistor in said former stage in accordance with said gain control signal; and a bias voltage control circuit which has a second control input end and a second control output end connected to said control portion of said signal-amplifying field-effect transistor in said latter stage and which is capable of controlling a main current of said signal-amplifying field-effect transistor in said latter stage according to said gain control signal, wherein the main current of said signal amplifying field-effect transistor in said latter stage is reduced when the gain of said signal-amplifying field-effect transistor in said former stage is lowered, wherein said bias voltage control circuit comprises a series connection circuit comprising a voltage-dividing resistor and a voltage-dividing field effect transistor connected between a bias voltage application portion and a grounding point, said control portion of said voltage-dividing field effect transistor is used as said second control input end of said bias voltage control circuit, and the connection point of said voltage-dividing resistor and said voltage-dividing field effect transistor is used as said second control output end of said bias voltage control circuit.

18. An amplifier in accordance with claim 17, wherein said control portion of said voltage-dividing field effect transistor is electrically connected to said gain control signal input portion in order to control said voltage-dividing field effect transistor by using said gain control signal.

* * * * *